United States Patent [19]

Moberg

[11] Patent Number: 4,684,824

[45] Date of Patent: Aug. 4, 1987

[54] CAPACITIVE LOAD DRIVER CIRCUIT

[75] Inventor: Gregory O. Moberg, Rochester, N.Y.

[73] Assignee: Eastman Kodak Company, Rochester, N.Y.

[21] Appl. No.: 719,090

[22] Filed: Apr. 2, 1985

[51] Int. Cl.[4] .................. H03K 3/01; H03K 17/56; H03K 3/26

[52] U.S. Cl. .................................. 307/270; 307/246

[58] Field of Search ............ 307/270, 268, 246, 254, 307/300, 474, 263; 328/114

[56] References Cited

U.S. PATENT DOCUMENTS

| | | | |
|---|---|---|---|
| 3,414,737 | 12/1968 | Bowers | 307/243 |
| 3,641,368 | 2/1972 | Gamble et al. | 307/300 |
| 3,769,528 | 10/1973 | Chu et al. | 307/270 |
| 3,824,408 | 7/1974 | Brunel | 307/214 |
| 3,895,238 | 7/1975 | Saari | 307/255 |
| 3,958,136 | 5/1976 | Schroeder | 307/254 |
| 4,251,742 | 2/1981 | Beelitz | 307/270 |
| 4,346,312 | 8/1982 | Christopherson | 307/270 |
| 4,427,902 | 1/1984 | Hickman et al. | 307/270 |

Primary Examiner—Stanley D. Miller
Assistant Examiner—Timothy P. Callahan
Attorney, Agent, or Firm—Milton S. Sales

[57] ABSTRACT

A capacitive load driver circuit which has good response time without cross-conduction includes a positive drive subcircuit for charging an output load in response to a first input logic signal, and a negative drive subcircuit for discharging the output load in response to a second logic signal. The charging rate of the positive drive subcircuit is greatly increased only during the existence of a predetermined difference between the actual and desired output voltage. The discharge rate of the negative drive subcircuit is greatly increased only when the rate of discharge exceeds a predetermined value.

5 Claims, 3 Drawing Figures

CAPACITIVE LOAD DRIVER CIRCUIT

FIELD OF THE INVENTION

This invention relates to a driver circuit for a capacitive load such as the gate of a metal-oxide-semiconductor field effect transistor (MOSFET) switching circuit. Driver circuits are used to interface between standard logic signal sources and succeeding heavier load, capacitive circuits.

DESCRIPTION OF THE PRIOR ART

Commonly, MOSFET driver circuits include a pair of bipolar transistors in series between a current supply and ground. This is known as a "totem pole" configuration, in which the transistor pair is driven by another bipolar transistor arranged as a phase-splitter (i.e., a transistor which produces from a single input wave, two output waves that differ in phase). The transistor closest to the current supply is referred to as the "source transistor," and the other transistor as the "sink transistor." The output signal of a totem pole circuit is obtained at the junction of the source transistor emitter and the sink transistor collector.

When the source transistor is conducting (on), the sink transistor should be non-conducting (off), and a logical "1" should appear at the driver circuit output. Conversely when the sink transistor is on, the source transistor should be off, and the driver circuit output should be at logical "0".

However, when turning off the sink transistor, slow depletion of stored minority carriers will often cause that transistor to be slow to turn off, attendantly both the source and sink transistors will conduct simultaneously. As a result, there is a direct path between the current supply and ground, causing large, undesirable current spikes (referred to herein as "cross-conduction") in the output stage.

Various suggestions have been made to reduce cross-conduction. A series resistor in the collector circuit of the source transistor reduces the severity of the problem. But where the load is highly capacitive, as in MOSFET gate drivers, a series resistor significantly degrades response time.

Reduced cross-conduction results from reducing the value of the resistor which normally bridges the base and emitter electrodes of the sink transistor to provide a lower impedance discharge path for minority carriers stored at the base of that transistor. This causes the transistor to turn off more quickly, but causes a degradation in circuit noise margin while merely reducing the duration of cross-conduction.

U.S. Pat. No. 3,824,408, which issued on July 16, 1974 to L. E. Andre Brunel discloses an inverting driver circuit which detects a delayed turn off of the sink transistor by comparing the logic levels of its input and output signals. If the levels are the same, an error signal is generated to enhance the turn off of the sink transistor. While the Brunel system may reduce the delay associated with the turning off of the sink transistor, it does not begin to function until after cross-conduction has been detected. The problem is not eliminated; but merely reduced.

Another arrangement for inhibiting current spikes in totem pole driver circuits is disclosed in U.S. Pat. No. 3,958,136, issued to P. R. Schroeder on May 18, 1976. Minority carrier drainage from the output sink transistor is expedited by providing a temporary low discharge path to the base of that transistor. However, if the output sink transistor does not turn off completely (not unlikely for a transistor large enough for use in a MOSFET driver circuit), cross-conduction can still occur. Further, the driver circuit cannot be returned to its logical "1" state until after the discharge path is opened, introducing an additional circuit delay.

Cross-conduction is eliminated by the circuit shown in U.S. Pat. No. 3,769,528, issued on Oct. 30, 1973 to W. M. Chu et al. A delay circuit prevents the output from going high until a feedback capacitor in the gate-to-source path of the driven FET is charged. However, the delay slows the circuit operation, and a solution without delays would be more desirable.

SUMMARY OF THE INVENTION

The invention achieves a capacitive load driver circuit which has good response time without cross-conduction. The driver circuit includes a positive drive subcircuit for charging an output load in response to a first input logic signal, and a negative drive subcircuit for discharging the output load in response to a second logic signal. Means are provided for greatly increasing the charging rate of the positive drive subcircuit only during the existence of a predetermined difference between the actual and desired output voltage. Means are also provided for greatly increasing the discharge rate of the negative drive subcircuit only when the rate of discharge exceeds a predetermined value.

In a preferred embodiment of the present invention, the means for increasing the charging rate is the source transistor of a totem pole circuit, and the means for increasing the discharge rate is the sink transistor of the totem pole circuit. The source transistor conducts only during the initial portion of the load-charging state of the driver circuit, while the sink transistor conducts only the initial portion of the load-discharging state of the driver circuit. Thus, the transistors are not simultaneously conducting, and there is no cross-conduction.

The capacitive load may be a MOSFET switching circuit. As used herein, the term "MOSFET driver" is intended to refer both to a power MOSFET driver and to a MOS clock driver.

The invention, and its objects and advantages, will become more apparent in the detailed description of the preferred embodiment presented below.

BRIEF DESCRIPTION OF THE DRAWINGS

In the detailed description of the preferred embodiment of the invention presented below, reference is made to the accompanying drawings in which.

DESCRIPTION OF PREFERRED EMBODIMENTS

Figure 1:
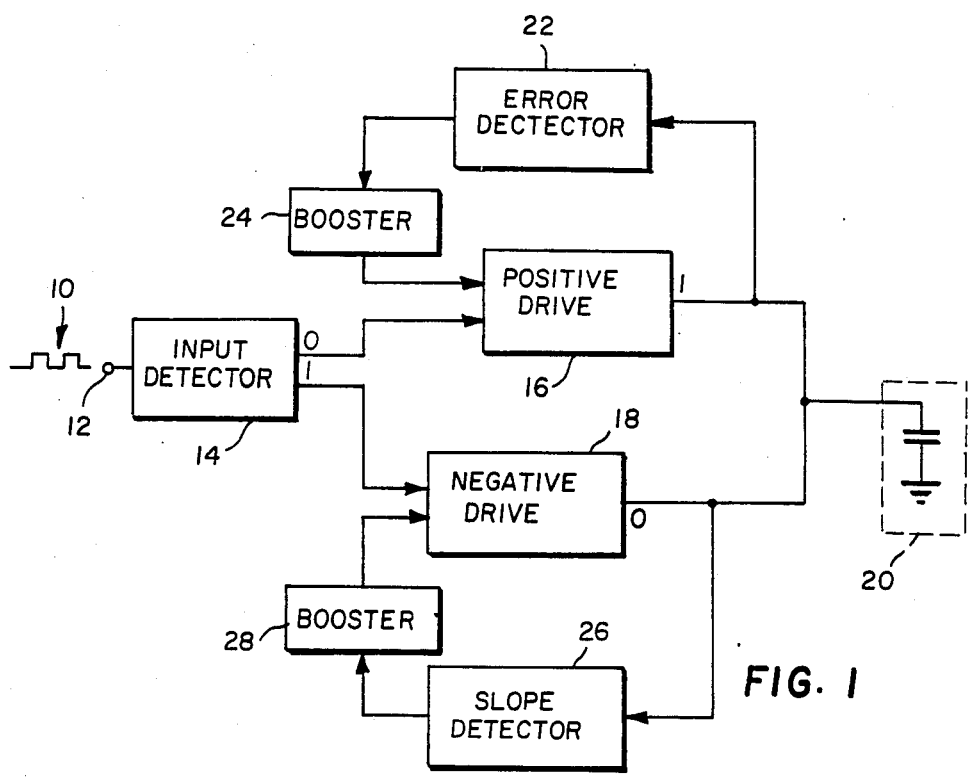
FIG. 1 is a functional diagram of MOSFET driver circuitry in accordance with the present invention.

The present description will be directed in part to elements forming part of, or cooperating more directly with, apparatus in accordance with the present invention. It is to be understood that elements not specifically shown or described may take various forms well known to those skilled in the art.

The invention will be explained in connection with its application as an N-CHANNEL MOSFET driver. While explained specifically in connection with the MOSFET, those skilled in the art will readily appreciate after reading the following description and referring to the drawings, that the invention and its teachings may be applied to any other switching element which exhibits essentially the same or equivalent characteristics as that of an N-CHANNEL MOSFET. For example, P-CHANNEL MOSFETs can also be driven.

A MOSFET has an inherent source-to-gate capacitance and drain-to-gate capacitance resulting from device construction, and possibly from stray wiring. The circuitry of the invention is especially adapted to a solid state switching element having such a capacitance characteristic.

In a switching application, the gate of the MOSFET may operate between 15 volts positive, at which the MOSFET is conducting (on), and zero volts, at which the MOSFET is nonconducting (off), while the input signal current of the driver swings between zero and a positive current.

The System

MOSFET driver circuitry according to the invention can be schematically illustrated as a system of subcircuits as in FIG. 1. Referring to that figure, an input logic signal, shown as a square wave 10, is applied at an input terminal 12 of an input detector subcircuit 14. The output of detector subcircuit 14 selectively activates either positive drive subcircuit 16 or negative drive subcircuit 18. That is, upon detection of a low (i.e., logic "0") input signal, detector subcircuit 14 actuates positive drive subcircuit 16 to begin charging a capacitive load 20.

Means for increasing the charging rate provided by positive drive 16 when an error detector subcircuit 22 senses a predetermined difference between the actual and desired voltage at the load includes a booster subcircuit 24. Booster subcircuit 24 causes positive drive subcircuit 16 to greatly increase the rate of charging of load 20. As the load voltage approaches the desired voltage, the booster subcircuit is deactivated, and final charging is accomplished at a slower rate.

In a similar manner, when detector subcircuit 14 senses initiation of a high, or logic "1", input signal, negative drive subcircuit 18 causes the capacitive load 20 to begin discharging. Means, including a negative drive booster subcircuit 28, are provided for increasing the discharge rate in response to the sensing of a negative-going load voltage by a slope detector subcircuit 26. As the load voltage approaches ground potential, its rate of decrease falls below a predetermined value. At that time, booster subcircuit 28 is deactivated and final discharge is accomplished at a reduced rate.

It can be seen that the negative drive booster subcircuit is actuated during only a short duration following detection of a rising input signal, and the positive drive booster is actuated during only a short duration following detection of a falling-input signal.

Figure 2:
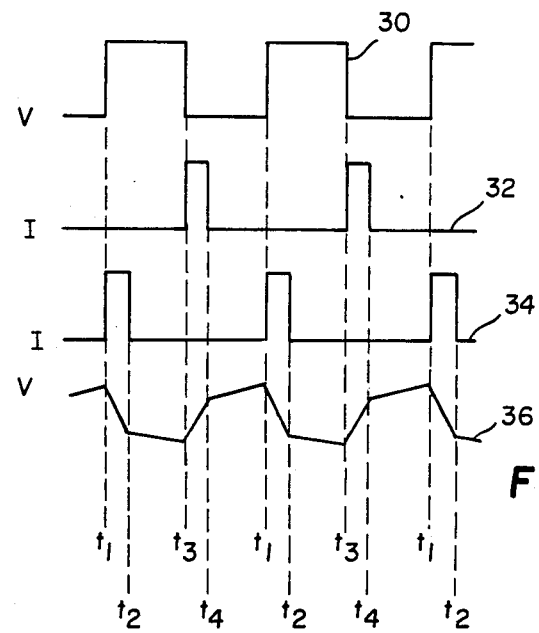
FIG. 2 is a timing diagram of typical signals during operation of the MOSFET driver circuitry.

With reference to the previous discussion, the timing diagram of FIG. 2 shows waveforms 30, 32, 34, and 36 which respectively represent the input voltage signal 10 applied to terminal 12, the current pulses of positive drive booster subcircuit 24, the current pulses of negative drive booster subcircuit 28, and finally the output voltage at load 20.

Prior to time $t_1$, the input (waveform 30) is assumed to be in a low, steady state condition with the output (waveform 36) high. At time $t_1$, the input goes high, actuating negative drive subcircuit 18. Ignoring time delays, slope detector 26 senses a falling output voltage and actuates negative drive booster 28 (waveform 34) to drive the load voltage rapidly toward ground. At time $t_2$, the rate of decay of the output voltage has decreased to a value insufficient to keep negative drive booster 28 actuated.

When the input voltage drops at time $t_3$, positive drive subcircuit 16 begins charging the load. Error detector subcircuit 22 actuates positive drive booster 24 (waveform 32) to increase the charging rate. Note that positive drive booster 24 is activated at time $t_3$, long after negative drive booster 28 has been deactivated at time $t_2$. Thus, simultaneous activation (and resulting cross-conduction) of the drive boosters is avoided.

As the output load voltage approaches its desired level after a falling edge of the input signal, positive drive booster 24 is deactivated (at time $t_4$) to prevent cross-conduction upon the detection of a subsequent rising edge of the input signal (at time $t'_1$).

The Preferred Embodiment Circuit

Figure 3:
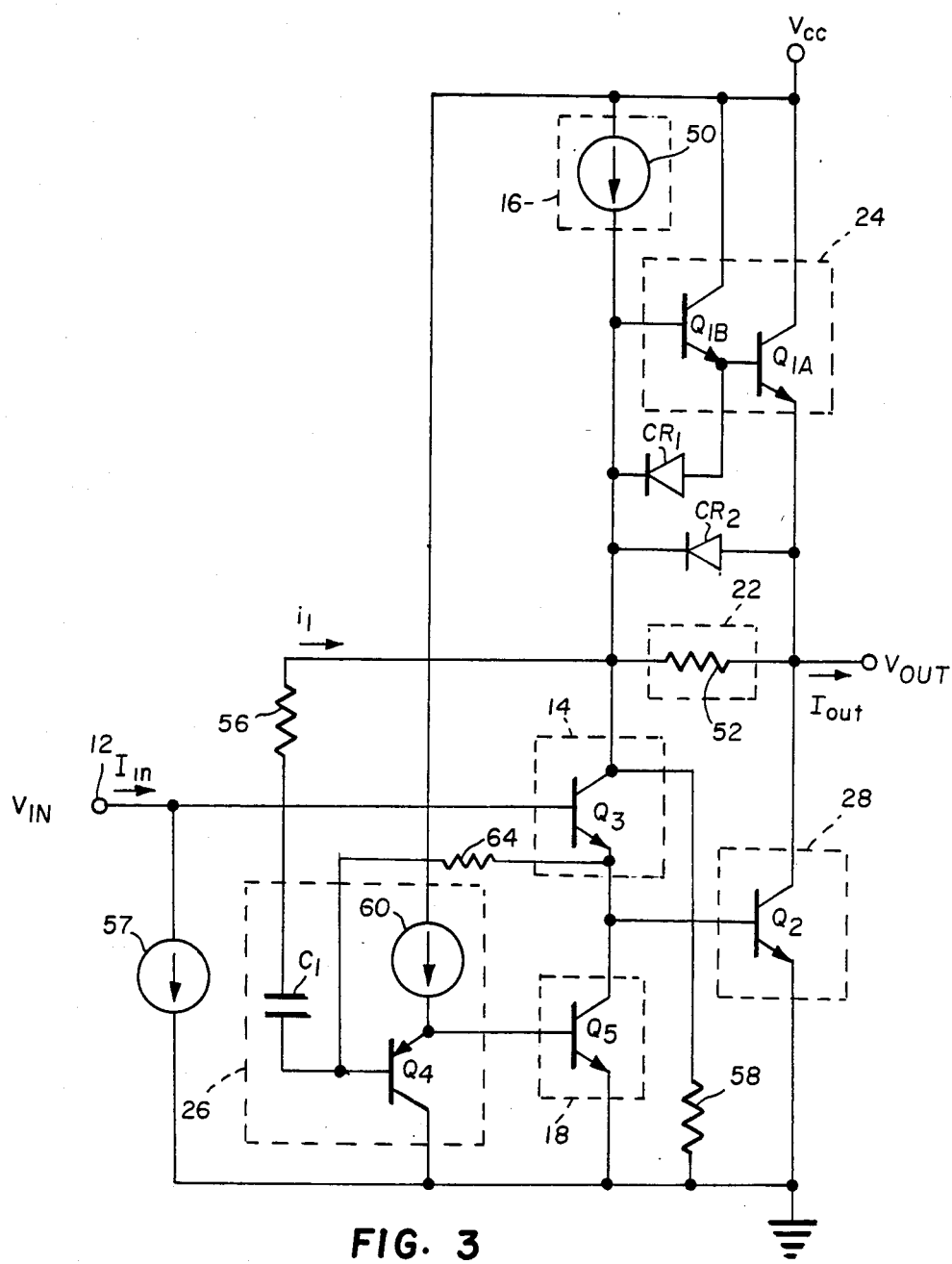
FIG. 3 is a circuit schematic diagram of a transistorized MOSFET driver circuit in accordance with a preferred embodiment of the present invention.

The system decribed above with respect to FIG. 1 can be effected by the preferred circuit illustrated in FIG. 3. Those skilled in the art will appreciate that other circuit configurations may be used to accomplish the desired MOSFET driver functions. The subcircuits of FIG. 1 have been generally identified in FIG. 3 by broken line boxes, and have been numbered according to their identification in FIG. 1. It will be understood that the circuit elements work in conjunction with each other, and that their placement into certain identified subcircuits is only for purposes of explanation; an element in one subcircuit may indeed affect operation of another subcircuit.

Positive drive booster subcircuit 24 comprises Darlington pair source transistors $Q_{1A}$ and $Q_{1B}$ arranged in a totem pole configuration with a sink transistor $Q_2$ of negative drive booster subcircuit 28.

Positive drive subcircuit 16 includes a current source 50 which sources current into the collector of a phase-splitter transistor $Q_3$ in input detector subcircuit 14. The collector of transistor $Q_3$ is also connected to the bases of transistors $Q_{1A}$ (via a diode $CR_1$) and $Q_{1B}$, to the output terminal (via a diode $CR_2$ and a resistor 52 of error detector subcircuit 22), to the base of a transistor $Q_4$ of slope detector subcircuit 26 (via a resistor 56 and a capacitor $C_1$), and to ground via a resistor 58. The base of phase-splitter transistor $Q_3$ is connected to input terminal 12 and to a current sink 57, which draws a predetermined amount of current from the input to ground. The emitter of transistor $Q_3$ is connected to the collector of a transistor $Q_5$ of negative drive subcircuit 18 and to the base of sink transistor $Q_2$. The base of transistor $Q_5$ is connected to the emitter of transistor $Q_4$, as is current source 60. The collector of transistor $Q_4$ and the emitters of transistors $Q_2$ and $Q_5$ are grounded.

Operation of the Preferred Embodiment

Under steady state conditions with $V_{IN}=0$ (logic 0) and $I_{IN}=0$, phase-splitter transistor $Q_3$ is off, transistor $Q_4$ is off, and transistor $Q_5$ on. Transistor $Q_5$ draws current from the base of sink transistor $Q_2$, keeping $Q_2$ off. Darlington pair transistors $Q_{1B}$ and $Q_{1A}$ are also off, and $V_{OUT}=V_{cc}$. Since the output load is capacitive, $I_{OUT} = 0$ for steady conditions. There is no voltage drop across diodes $CR_1$ and $CR_2$, which are therefore off, and current $i_1 = 0$.

As $I_{IN}$ increases during the transition period from input logic 0 to input logic 1 (time $t_1$ in FIG. 2), input detector subcircuit transistor $Q_3$ begins to conduct, sinking current from positive drive current source 50 through negative drive transistor $Q_5$ to ground. The resultant drop in voltage across diode $CR_2$ forward biases that diode, allowing current to be drawn from the output load to ground, also through transistors $Q_3$ and $Q_5$. This initiates a negative-going transition at the output.

To increase the rate of decay of the output voltage, slope detector subcircuit 26 actuates negative drive booster 28 as follows. The falling collector voltage of transistor $Q_3$ is AC coupled through capacitor $C_1$ to the base of transistor $Q_4$. When the base voltage of transistor $Q_4$ decreases, that transistor will conduct as an emitter follower, and short the base of transistor $Q_5$ to ground, thereby turning transistor $Q_5$ off. When transistor $Q_5$ turns off, sink transistor $Q_2$ is turned on to create a very low impedance current path from the output load to ground, acceleratin $V_{OUT}$ toward zero.

With diode $CR_2$ forward biased, the capacitive load then provides a source of change from which a current can be drawn. Thus, the current through transistor $Q_3$ is increased. This in turn increases the base current in transistor $Q_2$, and drives transistor $Q_2$ even further toward saturation. Thus the capacitive load is rapidly discharged with a high current pulse through sink transistor $Q_2$.

A $V_{OUT}$ approaches ground potential (time $t_2$ in FIG. 2), the rate of decrease in $V_{OUT}$ diminishes and diode $CR_2$ ceases to conduct. Although some current will continue to pass through transistor $Q_3$ via resistor 52 even after diode $CR_2$ turns off, its quantity will be reduced, and the rate of discharge through negative drive transistor $Q_2$ is reduced.

When the rate of decrease of $V_{OUT}$ slows, current $i_1$ returns toward zero, causing slope detector transistor $Q_4$ to turn off. Thus $Q_5$ turns on, and negative drive booster transistor $Q_2$ is turned off. The negative transition is completed by conduction through transistor $Q_3$ and negative drive transistor $Q_5$.

During the entire transition period, positive drive booster transistor $Q_{1A}$ has been off, and there has been no possibility of cross-conduction. In the low $V_{OUT}$ steady state condition, transistor $Q_2$ is off, and $V_{OUT}$ is maintained low by conduction through resistor 52 and transistors $Q_3$ and $Q_5$.

Now, if $V_{IN}$ changes to zero (time $t_3$ in FIG. 2), current sink 57 causes input detector transistor $Q_3$ to turn off. Positive drive current source 50 will begin increasing the base voltage of transistor $Q_{1B}$ toward $V_{cc}$, and begin to slowly increase $V_{OUT}$ through resistor 52. When the voltage across error detector resistor 52 equals two diode drops, positive drive booster Darlington pair transistors $Q_{1B}$ and $Q_{2B}$ turn on hard. This increases the charging rate of the conductive load, by means of a high current pulse, until the voltage across resistor 52 is again low enough to turn off transistors $Q_{1B}$ and $Q_{1A}$ (time $t_4$ in FIG. 2). After that, the positive-going transition is completed at a slower rate through resistor 52.

Note that during the entire positive-going transition, the voltage across capacitor $C_1$ was never such as to cause transistor $Q_4$ to conduct. Therefore, transistor $Q_5$ remained on, and transistor $Q_2$ off; preventing any cross-conduction.

Several components shown in FIG. 3 are not elements of the subcircuits of FIG. 1. These components are not essential to the circuit operation, but enhance its performance and reliability. Resistor 58 provides a leakage path to ground from the collector of transistor $Q_3$ to inhibit the output from drifting up during the power down mode (i.e., when all transistors are OFF, and the capacitive load would be otherwise open-circuited except for the path through resistor 58). Resistor 56 prevents ringing in slope detector 26 during transitions. Resistor 64 provides DC bias to the base of transistor $Q_4$. Diode $CR_1$ provides a discharge path for stray capacitance at the base of $Q_{1A}$, through $Q_3$, preventin $Q_{1A}$ from turning ON during negative going output transitions.

The invention in general and the preferred embodiment circuitry of FIG. 3 result in a MOSFET driver circuit which has good response time and in which current spiking (i.e. cross-conduction) is eliminated. While the invention has been described in detail with particular reference to certain preferred embodiments thereof, it will be understood that variations and modifications can be effected within the spirit and scop of the invention.

I claim:

1. A dricer circuit for a capacitive load, said driver circuit having an input terminal for application of an input logic signal, and an output terminal for connection to a capacitive load, and further comprising:
   a positive drive subcircuit operatively connected to the input terminal for charging the capacitive load in response to a given logic state at said input terminal;
   means for sensing a predetermined difference between an actual and a desired voltage at said output terminal;
   first means, operatively connected to said difference sensing means and said positive drive circuit, for greatly increasing the charging rate of the capacitive load only during the existence of said predetermined difference;
   a negative drive subcircuit operatively connected to the input terminal for discharging the capacitive load in response to another logic state at said input terminal;
   means for sensing the rate of discharge of the capacitive load; and
   second means, operatively connected to said rate sensing means and said negative drive circuit, for greatly increasing the discharge rate of the capacitive load only when the rate of discharge is greater than a predetermined value, whereby said first and second means are not operative simultaneously.

2. A driver circuit as defined in claim 1 wherein:
   a. said difference sensing means includes an error detector for sensing said predetermined voltage difference; and
   b. said first means includes a booster subcircuit responsive to said error detector for increasing the charging rate of said capacitive load by said positive drive subcircuit.

3. A driver circuit as defined in claim 1 wherein:
   a. said rate sensing means includes a slope detector for sensing when discharge rate exceeds said predetermined value; and b. said second means includes a negative drive booster subcircuit responsive to said slope detector for greatly increasing said discharge rate.

4. A driver circuit as defined in claim 1 wherein:

a. said difference sensing means comprises an error detector for sensing said predetermined voltage difference;

b. said first means includes a booster subcircuit for increasing the charging rate of said positive drive subcircuit;

c. said second rate sensing means comprises a slope detector for sensing when discharge rate exceeds said predetermined value; and d. said second means includes a negative drive booster subcircuit responsive to said slope detector for greatly increasing said discharge rate.

5. A driver circuit as defined in claim 4 wherein:

a. said positive drive booster subcircuit includes the source transistor of a totem pole pair, said source transistor being connected between a source and said output terminal and being biased to its ON state only in response to said error detector sensing said predetermined voltage difference; and b. said negative drive booster subcircuit includes the sink transistor of the totem pole pair, said sink transistor being connected between said output terminal and ground and being biased to its ON state only in response to said slope detector sensing a discharge rate in excess of said predetermined value.

* * * * *